(12) United States Patent
Han et al.

(10) Patent No.: US 10,147,706 B2
(45) Date of Patent: Dec. 4, 2018

(54) MULTI-CHIP PACKAGE AND METHOD OF MANUFACTURING THE SAME

(71) Applicant: SAMSUNG ELECTRONICS CO., LTD., Suwon-si, Gyeonggi-do (KR)

(72) Inventors: Won-Gil Han, Cheongju-si (KR); Byong-Joo Kim, Asan-si (KR); Yong-Je Lee, Hwaseong-si (KR); Jae-Heung Lee, Cheonan-si (KR); Seung-Weon Ha, Cheonan-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/623,891

(22) Filed: Jun. 15, 2017

(65) Prior Publication Data

US 2018/0114776 A1 Apr. 26, 2018

(30) Foreign Application Priority Data

Oct. 24, 2016 (KR) .................. 10-2016-0138090

(51) Int. Cl.
*H01L 25/065* (2006.01)
*H01L 23/00* (2006.01)

(52) U.S. Cl.
CPC .......... *H01L 25/0657* (2013.01); *H01L 24/48* (2013.01); *H01L 24/49* (2013.01); *H01L 24/73* (2013.01); *H01L 24/83* (2013.01); *H01L 2225/0651* (2013.01); *H01L 2225/06506* (2013.01); *H01L 2225/06562* (2013.01)

(58) Field of Classification Search
CPC ....... H01L 25/0657; H01L 2225/06562; H01L 2225/06506; H01L 2225/0651
See application file for complete search history.

(56) References Cited

U.S. PATENT DOCUMENTS

| 9,252,123 B2 | 2/2016 | Han et al. | |
| 2008/0242076 A1 | 10/2008 | Takiar et al. | |
| 2010/0187690 A1* | 7/2010 | Okada | H01L 24/45 257/738 |
| 2011/0068449 A1* | 3/2011 | Kook | H01L 23/49575 257/676 |

(Continued)

FOREIGN PATENT DOCUMENTS

| JP | 2014-187221 | * 10/2014 |
| KR | 10-2009-0113679 A | 11/2009 |

(Continued)

*Primary Examiner* — A. Sefer
(74) *Attorney, Agent, or Firm* — Lee & Morse P.C.

(57) ABSTRACT

A multi-chip package includes a package substrate including a first substrate pad, a first group of semiconductor chips stacked on the package substrate, each of the first group of the semiconductor chips including bonding pads, first stud bumps arranged on the bonding pads of the first group of the semiconductor chips except for a lowermost semiconductor chip in the first group, a first conductive wire downwardly extended from the bonding pad of the lowermost semiconductor chip in the first group and connected to the first substrate pad, and a second conductive wire upwardly extended from the bonding pad of the lowermost semiconductor chip in the first group and sequentially connected to the first stud bumps.

20 Claims, 20 Drawing Sheets

(56) References Cited

U.S. PATENT DOCUMENTS

| | | | |
|---|---|---|---|
| 2012/0013026 A1* | 1/2012 | Han | ........................ H01L 24/49 |
| | | | 257/777 |
| 2012/0056178 A1* | 3/2012 | Han | ........................ H01L 22/32 |
| | | | 257/48 |
| 2014/0021608 A1 | 1/2014 | Choi | |
| 2014/0183727 A1 | 7/2014 | Lu et al. | |
| 2015/0021761 A1 | 1/2015 | Park | |

FOREIGN PATENT DOCUMENTS

| KR | 10-2010-0036064 A | 4/2010 |
|---|---|---|
| KR | 10-2010-0037351 A | 4/2010 |

\* cited by examiner

MULTI-CHIP PACKAGE AND METHOD OF MANUFACTURING THE SAME

CROSS-REFERENCE TO RELATED APPLICATION

Korean Patent Application No. 10-2016-0138090, filed on Oct. 24, 2016, in the Korean Intellectual Property Office, and entitled: "Multi-Chip Package and Method of Manufacturing the Same," is incorporated by reference herein in its entirety.

BACKGROUND

1. Field

Example embodiments relate to a multi-chip package and a method of manufacturing the same. More particularly, example embodiments relate to a multi-chip package including a plurality of semiconductor chips connected with each other by conductive wires, and a method of manufacturing the multi-chip package.

2. Description of the Related Art

A multi-chip package may include a package substrate, a plurality of semiconductor chips, and conductive wires. The semiconductor chips may be stacked on the package substrate. The conductive wires may be electrically connected between the package substrate and the semiconductor chips, and between the semiconductor chips.

SUMMARY

According to example embodiments, there may be provided a multi-chip package. The multi-chip package may include a package substrate, a first group of semiconductor chips, first stud bumps, a first conductive wire and a second conductive wire. The package substrate may include a first substrate pad. The first group of the semiconductor chips may be stacked on the package substrate. Each of the first group of the semiconductor chips may include bonding pads. The first stud bumps may be arranged on the bonding pads of the first group of the semiconductor chips except for a lowermost semiconductor chip. The first conductive wire may be downwardly extended from the bonding pad of the lowermost semiconductor chip. The first conductive wire may be connected to the first substrate pad. The second conductive wire may be upwardly extended from the bonding pad of the lowermost semiconductor chip. The second conductive wire may be sequentially connected to the first stud bumps.

According to example embodiments, there may be provided a multi-chip package. The multi-chip package may include a package substrate, first to fourth semiconductor chips, stud bumps, a first conductive wire and a second conductive wire. The package substrate may include a first substrate pad. The first to fourth semiconductor chips may be stacked on the package substrate in a steplike shape. Each of the first to fourth semiconductor chips may include bonding pads. The first to fourth semiconductor chips may have substantially the same size. The stud bumps may be arranged on the bonding pads of the second to fourth semiconductor chips. The first conductive wire may include a first ball attached to the bonding pad of the first semiconductor chip. The first conductive wire may be downwardly extended from the first ball. The first conductive wire may be connected to the substrate pad. The second conductive wire may include a second ball attached to the first ball. The second conductive wire may be upwardly extended from the second ball. The second conductive wire may be sequentially connected to the stud bumps.

According to example embodiments, there may be provided a multi-chip package. The multi-chip package may include a package substrate including a first substrate pad, a first group of semiconductor chips stacked on the package substrate, each one of the semiconductor chips in the first group including at least one bonding pad, a first stud bump on each bonding pad of the first group of the semiconductor chips except for a lowermost semiconductor chip in the first group, a first conductive wire extending from the at least one bonding pad of the lowermost semiconductor chip in the first group to contact the first substrate pad, and a second conductive wire extending continuously from the at least one bonding pad of the lowermost semiconductor chip in the first group to contact at least one first stud bump on each of the semiconductor chips on the lowermost semiconductor chip in the first group.

According to example embodiments, there may be provided a method of manufacturing a multi-chip package. In the method of manufacturing the multi-chip package, a first group of semiconductor chips may be stacked on a package substrate including a first substrate pad. First stud bumps may be formed on bonding pads of the first group of the semiconductor chips except for a lowermost semiconductor chip. A first conductive wire may be downwardly extended from the bonding pad of the lowermost semiconductor chip. The first conductive wire may be connected to the first substrate pad. A second conductive wire may be upwardly extended from the bonding pad of the lowermost semiconductor chip. The second conductive wire may be sequentially connected to the first stud bumps.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Hereinafter, example embodiments will be explained in detail with reference to the accompanying drawings.

Figure 1:
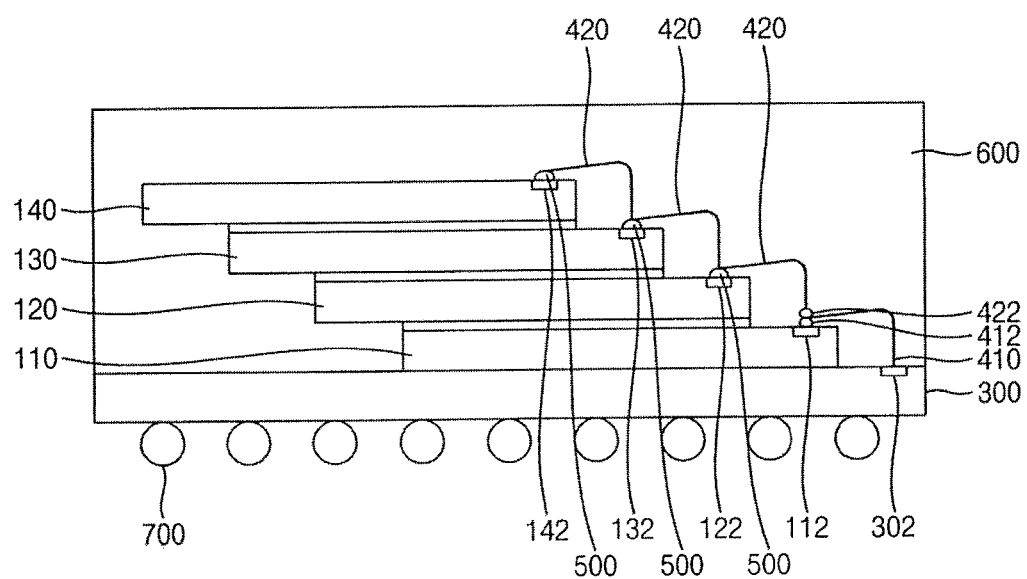
FIG. 1 illustrates a cross-sectional view of a multi-chip package in accordance with example embodiments.
Figure 2:
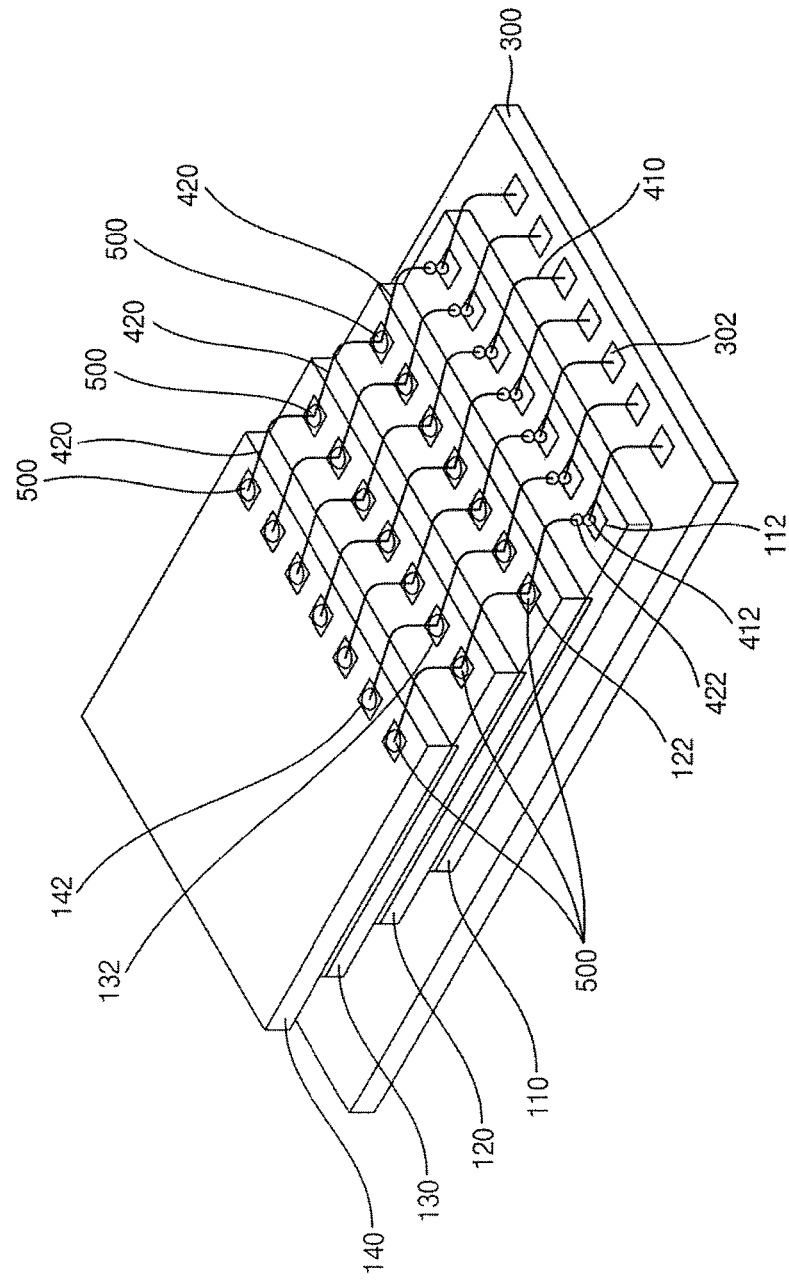
FIG. 2 illustrates a perspective view of semiconductor chips stacked on a package substrate of the multi-chip package in FIG. 1.

FIG. 1 is a cross-sectional view illustrating a multi-chip package in accordance with example embodiments, and FIG. 2 is a perspective view illustrating semiconductor chips stacked on a package substrate of the multi-chip package in FIG. 1.

Referring to FIGS. 1 and 2, a multi-chip package of this example embodiment may include a package substrate 300, first to fourth semiconductor chips 110, 120, 130 and 140, stud bumps 500, a first conductive wire 410, a second conductive wire 420, a molding member 600, and external terminals 700.

The package substrate 300 may have, e.g., a rectangular shape. The package substrate 300 may include an insulating substrate and a conductive pattern formed in the insulating substrate. The conductive patterns may include an upper end exposed through an upper surface of the insulating substrate, and a lower end exposed through a lower surface of the insulating substrate. A substrate pad 302 may be formed on the upper end of the conductive pattern, e.g., on the upper surface of the insulating substrate. The substrate pad 302 may be positioned at an edge, e.g., a right edge portion, of the upper surface of the package substrate 300.

The first to fourth semiconductor chips 110, 120, 130 and 140 may be stacked on, e.g., directly on, the upper surface of the package substrate 300 to expose the substrate pad 302. The first to fourth semiconductor chips 110, 120, 130 and 140 may have substantially the same size. Alternatively, the multi-chip package may include two, three or at least five semiconductor chips, e.g., stacked directly on each other.

The first semiconductor chip 110 may include a first bonding pad 112. The first bonding pad 112 may be positioned at an edge, e.g., a right edge portion, of an upper surface of the first semiconductor chip 110. The second semiconductor chip 120 may include a second bonding pad 122. The second bonding pad 122 may be positioned at an edge, e.g., a right edge portion, of an upper surface of the second semiconductor chip 120. The third semiconductor chip 130 may include a third bonding pad 132. The third bonding pad 132 may be positioned at an edge, e.g., a right edge portion, of an upper surface of the third semiconductor chip 130. The fourth semiconductor chip 140 may include a fourth bonding pad 142. The fourth bonding pad 142 may be positioned at an edge, e.g., a right edge portion, of an upper surface of the fourth semiconductor chip 140. For example, each of the first to fourth bonding pads 112 to 142 may be positioned at a same side and edge of a corresponding first to fourth semiconductor chip 110 to 140 as the substrate pad 302 relative to the package substrate 300, e.g., at the right edge portion. For example, as illustrated in FIG. 2, each of the first through fourth semiconductor chips 110 through 140 may include a plurality of bonding pads aligned along an edge thereof.

The first semiconductor chip 110 may be stacked on the upper surface of the package substrate 300 to expose the substrate pad 302. The second semiconductor chip 120 may be stacked on the upper surface of the first semiconductor chip 110 to expose the first bonding pad 112. The third semiconductor chip 130 may be stacked on the upper surface of the second semiconductor chip 120 to expose the second bonding pad 122. The fourth semiconductor chip 140 may be stacked on the upper surface of the third semiconductor chip 130 to expose the third bonding pad 132. That is, the first to fourth semiconductor chips 110, 120, 130 and 140 may be sequentially stacked on the package substrate 300 along a left direction in a steplike shape. In other words, each of the first to fourth semiconductor chips 110, 120, 130 and 140 may be shifted in a direction opposite to that of the bonding pads, e.g., shifted to the left away from respective bonding pads at the right edge portions, in a step configuration.

Because the first to fourth semiconductor chips 110, 120, 130 and 140 may have substantially the same size, the step configuration may cause a side of each the first to fourth semiconductor chips 110, 120, 130 and 140 opposite to that of the bonding pads to protrude, e.g., overhang, beyond an underlying semiconductor chip, as illustrated in FIG. 1. That is, because the first to fourth semiconductor chips 110, 120, 130 and 140 may have substantially the same size, a left side surface of the second semiconductor chip 120 may protrude from a left side surface of the first semiconductor chip 110, a left side surface of the third semiconductor chip 130 may protrude from the left side surface of the second semiconductor chip 120, and a left side surface of the fourth semiconductor chip 140 may protrude from the left side surface of the third semiconductor chip 130.

The stud bumps 500 may be formed on the second bonding pad 122, the third bonding pad 132, and the fourth bonding pad 142. In contrast, the stud bump 500 may not be formed on the first bonding pad 112.

The first conductive wire 410 may be downwardly extended from the first bonding pad 112. The first conductive wire 410 may be connected to the substrate pad 302. That is, the first conductive wire 410 may include an upper end connected to the first bonding pad 112, and a lower end extended from the upper end and connected to the substrate pad 302.

The first conductive wire 410 may include a first ball 412 attached to the first bonding pad 112. The first ball 412 may be integrally formed with the upper end of the first conductive wire 410. Thus, the first conductive wire 410 may be extended from the first ball 412 and connected to the substrate pad 302.

The second conductive wire 420 may be upwardly extended from the first bonding pad 112. The second conductive wire 420 may be sequentially connected to the stud bumps 500. The second conductive wire 420 may include a second ball 422 attached to the first ball 412. The second ball 422 may be integrally formed with a lower end of the second conductive wire 420.

The second conductive wire 420 may be upwardly extended from the second ball 422. The second conductive wire 420 may be connected to the stud bump 500 on the second bonding pad 122 of the second semiconductor chip 120. The second conductive wire 420 may be continuously extended upwardly from the stud bump 500 on the second bonding pad 122. The second conductive wire 420 may be connected to the stud bump 500 on the third bonding pad 132 of the third semiconductor chip 130. The second conductive wire 420 may be continuously extended upwardly from the stud bump 500 on the third bonding pad 132. The second conductive wire 420 may be connected to the stud bump 500 on the fourth bonding pad 142 of the fourth semiconductor chip 140. That is, the second conductive wire 420 may correspond to a single wire extended, e.g., continuously, upwardly from the second ball 422 and sequentially connected to the stud bumps 500, e.g., on each of the second through fourth semiconductor chips 120 through 140.

The molding member 600 may be formed on the upper surface of the package substrate 300 to cover the first to fourth semiconductor chips 110, 120, 130 and 140, the first conductive wire 410, and the second conductive wire 420. The molding member 600 may include, e.g., an epoxy molding compound (EMC).

The external terminals 700 may be mounted on the lower ends of the conductive patterns exposed through the lower surface of the package substrate 300. The external terminals 700 may include solder balls.

FIGS. 3 to 12 are cross-sectional views illustrating stages in a method of manufacturing the multi-chip package in FIG. 1.

Figure 3:
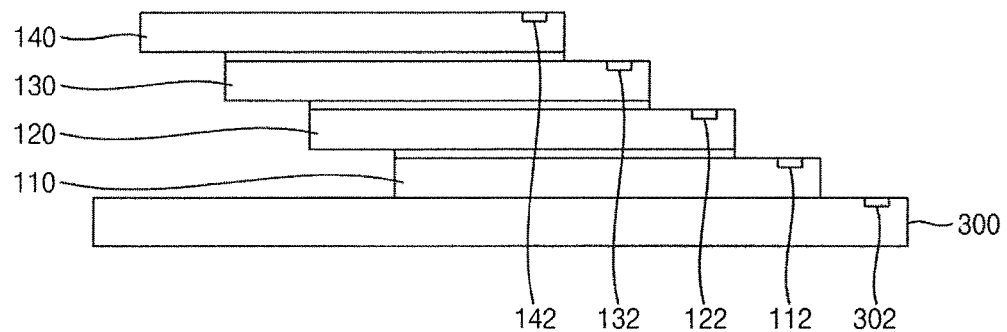
FIGS. 3 to 12 illustrate cross-sectional views of stages in a method of manufacturing the multi-chip package in FIG. 1.

Referring to FIG. 3, the first semiconductor chip 110 may be stacked on the upper surface of the package substrate 300 to expose the substrate pad 302. The second semiconductor chip 120 may be stacked on the upper surface of the first semiconductor chip 110 to expose the first bonding pad 112. The third semiconductor chip 130 may be stacked on the upper surface of the second semiconductor chip 120 to expose the second bonding pad 122. The fourth semiconductor chip 140 may be stacked on the upper surface of the third semiconductor chip 130 to expose the third bonding pad 132.

Figure 4:
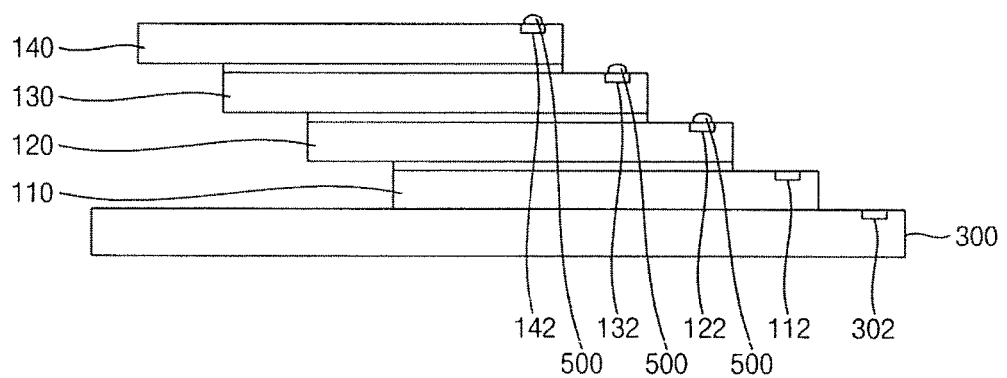

Referring to FIG. 4, the stud bumps 500 may be formed on the second bonding pad 122, the third bonding pad 132, and the fourth bonding pad 142. The stud bumps 500 may be formed by applying a spark to a lower end of a wire drawn from a capillary. In contrast, the stud bump 500 may not be formed on the first bonding pad 112.

Figure 5:
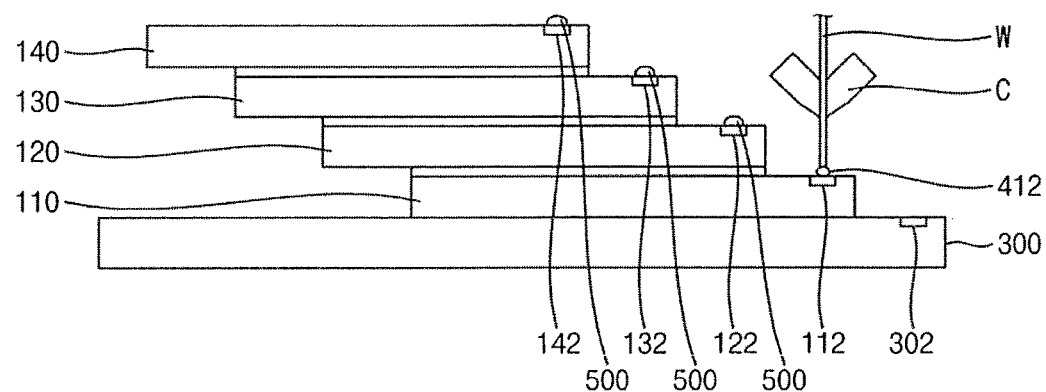

Referring to FIG. 5, the capillary C may be arranged over the first bonding pad 112. The first ball 412 may be formed at the lower end of the wire W drawn from the capillary C. The first ball 412 may be attached to the first bonding pad 112.

Figure 6:
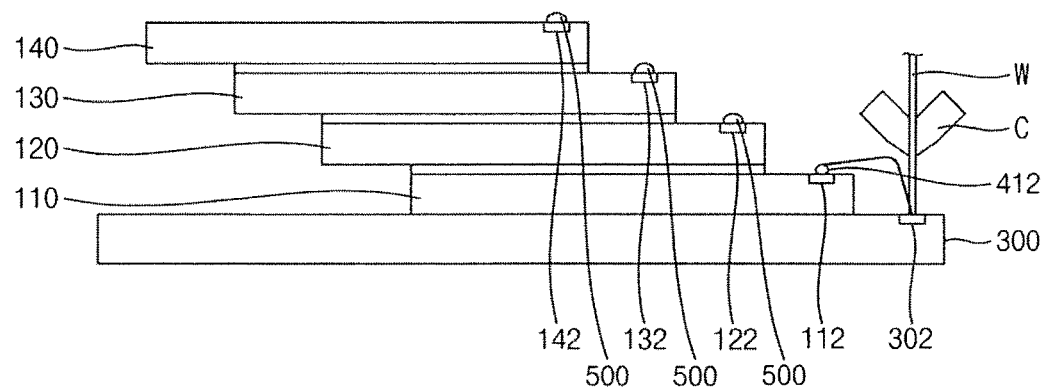

Referring to FIG. 6, the capillary C may be moved to a region over the substrate pad 302 in a horizontal direction. Thus, the wire W extended from the first ball 412 may be located over the substrate pad 302. The capillary C may be downwardly moved toward the substrate pad 302 to stitch the wire W to the substrate pad 302.

Figure 7:
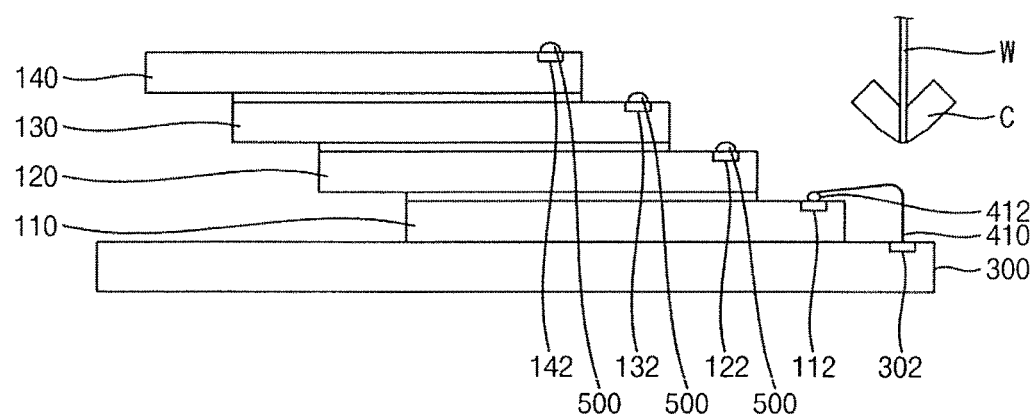

Referring to FIG. 7, the wire W extended from the substrate pad 302 to the capillary C may be cut to form the first conductive wire 410. The first conductive wire 410 may be downwardly extended from the first ball 412 attached to the first bonding pad 112. The first conductive wire 410 may be connected to the substrate pad 302.

Figure 8:
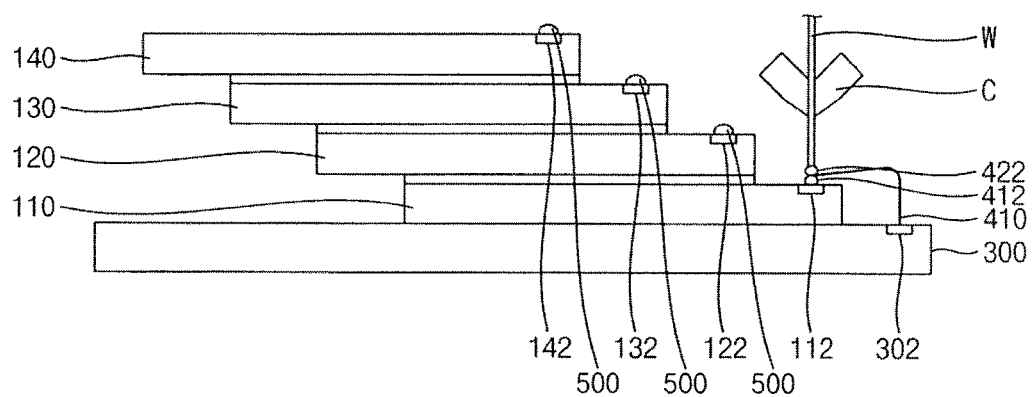

Referring to FIG. 8, the capillary C may be arranged over the first bonding pad 112. The second ball 422 may be formed at a lower end of the wire W drawn from the capillary C. The second ball 422 may be attached to the first ball 412.

Figure 9:
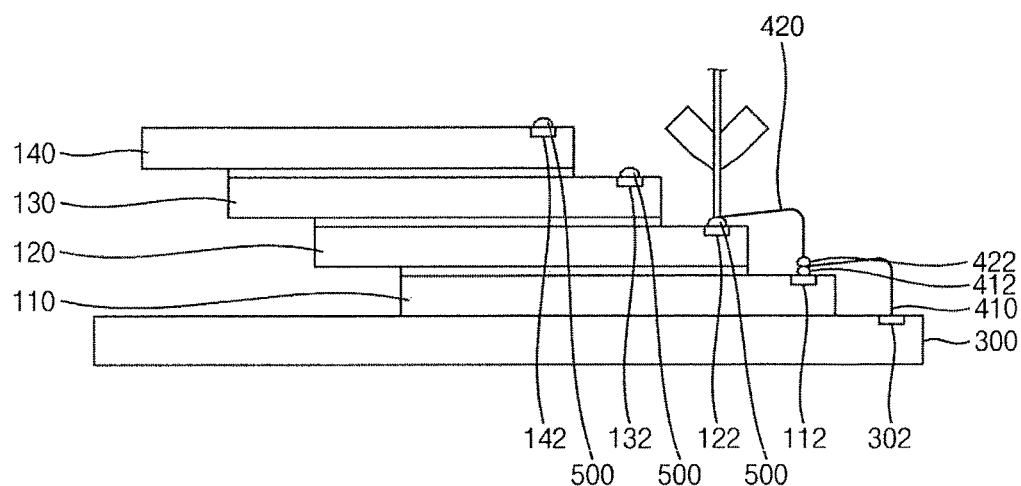

Referring to FIG. 9, the capillary C may be upwardly moved in a vertical direction. The capillary C may then be moved toward the second bonding pad 122 in the horizontal direction. Thus, the wire W extended from the second ball 422 may be connected to the stud bump 500 on the second bonding pad 122. Because the capillary C may be moved in the horizontal direction. e.g., only, after upwardly moving the capillary C, a sufficient gap between the loop formed by the wire W and the side surface of the second semiconductor chip 120 may be formed. For example, the capillary C may be moved in two stages in two different directions, e.g., vertically and horizontally, to define a tilted L-shaped wire, e.g., a wire having two substantially linear portions at a non-zero angle with respect to each other, spaced apart from a lateral side of the second semiconductor chip 120 facing the wire W. Therefore, the wire W may not make contact with the side surface of the second semiconductor chip 120.

Figure 10:
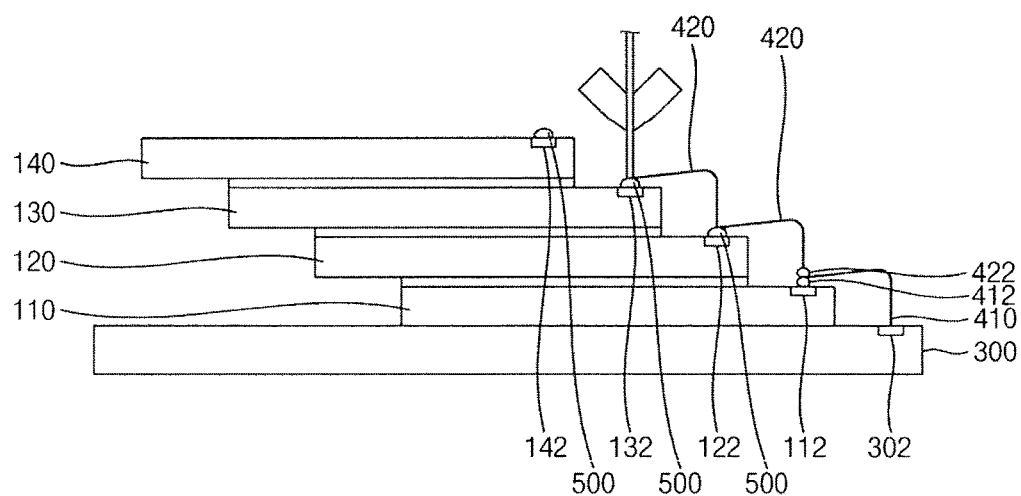

Referring to FIG. 10, the capillary C may be upwardly moved in the vertical direction. The capillary C may then be moved toward the third bonding pad 132 in the horizontal direction. Thus, the wire W extended from the stud bump 500 on the second bonding pad 122 may be connected to the stud bump 500 on the third bonding pad 132. As mentioned above, because the capillary C may be moved in the horizontal direction after upwardly moving the capillary C, a sufficient gap between the loop formed by the wire W and the side surface of the third semiconductor chip 130 may be formed. Therefore, the wire W may not make contact with the side surface of the third semiconductor chip 130.

Figure 11:
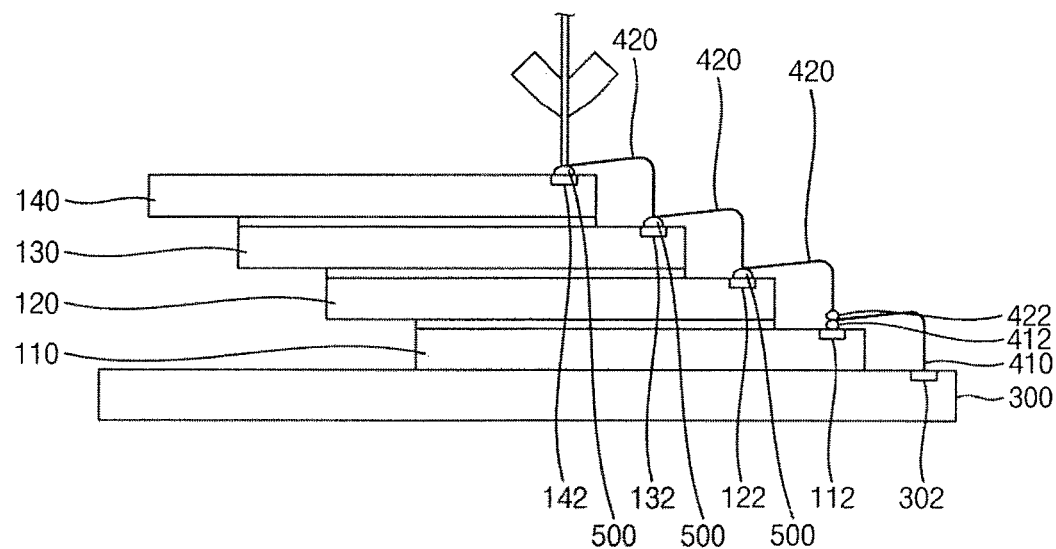

Referring to FIG. 11, the capillary C may be upwardly moved in the vertical direction. The capillary C may then be moved toward the fourth bonding pad 142 in the horizontal direction. Thus, the wire W extended from the stud bump 500 on the third bonding pad 132 may be connected to the stud bump 500 on the fourth bonding pad 142. As mentioned above, because the capillary C may be moved in the horizontal direction after upwardly moving the capillary C, a sufficient gap between the loop formed by the wire W and the side surface of the fourth semiconductor chip 140 may be formed. Therefore, the wire W may not make contact with the side surface of the fourth semiconductor chip 140.

Figure 12:
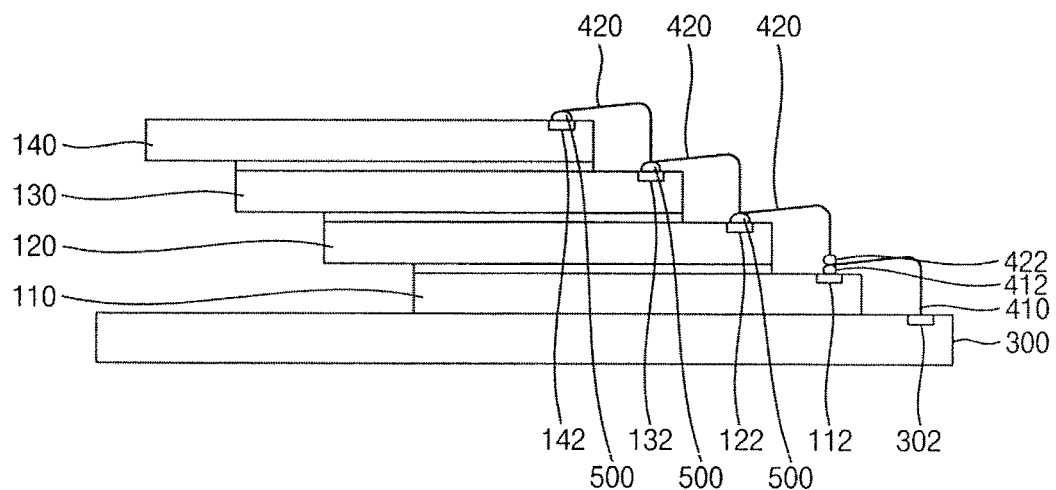

Referring to FIG. 12, the wire W extended from the stud bump 500 on the fourth bonding pad 142 to the capillary C may be cut to form the second conductive wire 420. The second conductive wire 420 may be upwardly extended from the second ball 422 attached to the first ball 412. The second conductive wire 420 may be sequentially connected with the stud bumps 500 on the second to fourth bonding pads 122, 132 and 142.

The molding member 600 may be formed on the upper surface of the package substrate 300 to cover the first to fourth semiconductor chips 110, 120, 130 and 140, the first conductive wire 410, and the second conductive wire 420. The external terminals 700 may be mounted on the lower ends of the conductive patterns exposed through the lower surface of the package substrate 300 to complete the multi-chip package in FIG. 1.

Figure 13:
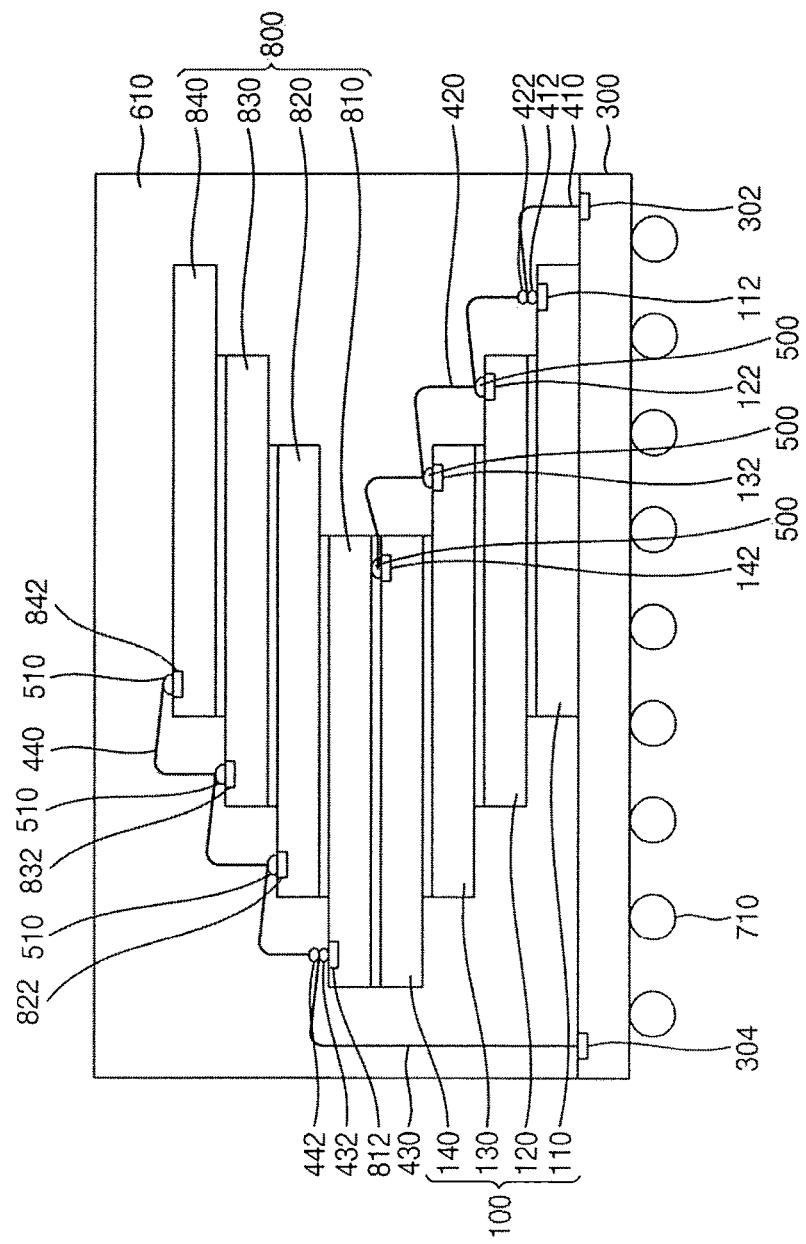
FIG. 13 illustrates a cross-sectional view of a multi-chip package in accordance with example embodiments.

FIG. 13 is a cross-sectional view illustrating a multi-chip package in accordance with example embodiments.

Referring to FIG. 13, a multi-chip package of this example embodiment may include the package substrate 300, a first group of semiconductor chips 100, the first stud bumps 500, the first conductive wire 410, the second conductive wire 420, a second group of semiconductor chips 800, second stud bumps 510, a third conductive wire 430, a fourth conductive wire 440, a molding member 610, and external terminals 710.

The package substrate 300 may include the first substrate pad 302 and a second substrate pad 304. The first substrate pad 302 may be positioned, e.g., at a right edge portion of the upper surface of the package substrate 300. The second substrate pad 304 may be positioned at an opposite side of the package substrate 300 with respect to the first substrate pad 302, e.g., at a left edge portion of the upper surface of the package substrate 300.

The first group of the semiconductor chips 100, the first stud bumps 500, the first conductive wire 410, and the second conductive wire 420 in FIG. 13 may be substantially the same as the first to fourth semiconductor chips 110, 120, 130, and 140, the stud bumps 500, the first conductive wire 410, and the second conductive wire 420 in FIG. 1, respectively. Thus, any further illustrations with respect to the first group of the semiconductor chips 100, the first stud bumps 500, the first conductive wire 410, and the second conductive wire 420 in FIG. 13 may be omitted herein for brevity. The first conductive wire 410 may be connected to the first substrate pad 302.

The second group of the semiconductor chips 800 may include first to fourth semiconductor chips 810, 820, 830, and 840. The first to fourth semiconductor chips 810, 820, 830, and 840 in the second group may be stacked on the upper surface of the fourth semiconductor chip 140 in the first group in a steplike shape. The first to fourth semiconductor chips 810, 820, 830, and 840 in the second group may have substantially the same size. Further, the size of the second group of the semiconductor chips 800 may be substantially the same as the size of the first group of the semiconductor chips 100. Alternatively, the second group of the semiconductor chips 800 may include two, three or at least five semiconductor chips.

The first to fourth semiconductor chips 810, 820, 830, and 840 may include bonding pads at an opposite side with respect to the bonding pads in the first group of semiconductor chips 100. In detail, the first semiconductor chip 810 may include a first bonding pad 812. The first bonding pad 812 may be positioned at a left edge portion of an upper surface of the first semiconductor chip 810. The second semiconductor chip 820 may include a second bonding pad 822. The second bonding pad 822 may be positioned at a left edge portion of an upper surface of the second semiconductor chip 820. The third semiconductor chip 830 may include a third bonding pad 832. The third bonding pad 832 may be positioned at a left edge portion of an upper surface of the third semiconductor chip 830. The fourth semiconductor chip 840 may include a fourth bonding pad 842. The fourth bonding pad 842 may be positioned at a left edge portion of an upper surface of the fourth semiconductor chip 840.

The second semiconductor chip 820 may be stacked on the upper surface of the first semiconductor chip 810 to expose the first bonding pad 812. The third semiconductor chip 830 may be stacked on the upper surface of the second semiconductor chip 820 to expose the second bonding pad 822. The fourth semiconductor chip 840 may be stacked on the upper surface of the third semiconductor chip 830 to expose the third bonding pad 832. That is, the first to fourth semiconductor chips 810, 820, 830 and 840 may be sequentially stacked along a right direction in a steplike shape. For example, as illustrated in FIG. 13, the first to fourth semiconductor chips 810, 820, 830, and 840 may be shifted in an opposite direction with respect to the pads to be arranged symmetrically with respect to the first group of semiconductor chips 100 relative to a plane separating the fourth semiconductor chip 140 of the first group of semiconductor chips 100 from the first semiconductor chip 810 of the second group of semiconductor chips.

The second stud bumps 510 may be formed on the second bonding pad 822, the third bonding pad 832, and the fourth bonding pad 842. In contrast, the second stud bump 510 may not be formed on the first bonding pad 812.

The third conductive wire 430 may be downwardly extended from the first bonding pad 812. The third conductive wire 430 may be connected to the second substrate pad 304. Alternatively, the third conductive wire 430 may be connected to a control chip on the package substrate 300.

The third conductive wire 430 may include a third ball 432 attached to the first bonding pad 812. The third ball 432 may be integrally formed with the upper end of the third conductive wire 430. Thus, the third conductive wire 430 may be extended from the third ball 432 and connected to the second substrate pad 304.

The fourth conductive wire 440 may be upwardly extended from the first bonding pad 812. The fourth conductive wire 440 may be sequentially connected to the second stud bumps 510. The fourth conductive wire 440 may include a fourth ball 442 attached to the third ball 432. The fourth ball 442 may be integrally formed with a lower end of the fourth conductive wire 440.

The fourth conductive wire 440 may be upwardly extended from the fourth ball 442. The fourth conductive wire 440 may be connected to the second stud bump 510 on the second bonding pad 822 of the second semiconductor chip 820. The fourth conductive wire 440 may be continuously extended upwardly from the second stud bump 510 on the second bonding pad 822. The fourth conductive wire 440 may be connected to the second stud bump 510 on the third bonding pad 832 of the third semiconductor chip 830. The fourth conductive wire 440 may be continuously extended upwardly from the second stud bump 510 on the third bonding pad 832. The fourth conductive wire 440 may be connected to the second stud bump 510 on the fourth bonding pad 842 of the fourth semiconductor chip 840. That is, the fourth conductive wire 440 may correspond to a single wire extended upwardly from the fourth ball 422 and sequentially connected to the second stud bumps 510.

The molding member 610 may be formed on the upper surface of the package substrate 300 to cover the first group of the semiconductor chips 100, the second group of the semiconductor chips 800 and the first to fourth conductive wires 410, 420, 430 and 440.

The external terminals 710 may be mounted on the lower ends of the conductive patterns exposed through the lower surface of the package substrate 300.

FIGS. 14 to 23 are cross-sectional views illustrating stages in a method of manufacturing the multi-chip package in FIG. 13.

Processes substantially the same as those illustrated with reference to FIGS. 3 to 12 may be performed to stack the first group of the semiconductor chips 100 on the package substrate 300 in the steplike shape and to electrically connect the first group of the semiconductor chips 100 with the package substrate 300 using the first and second conductive wires 410 and 420.

Figure 14:
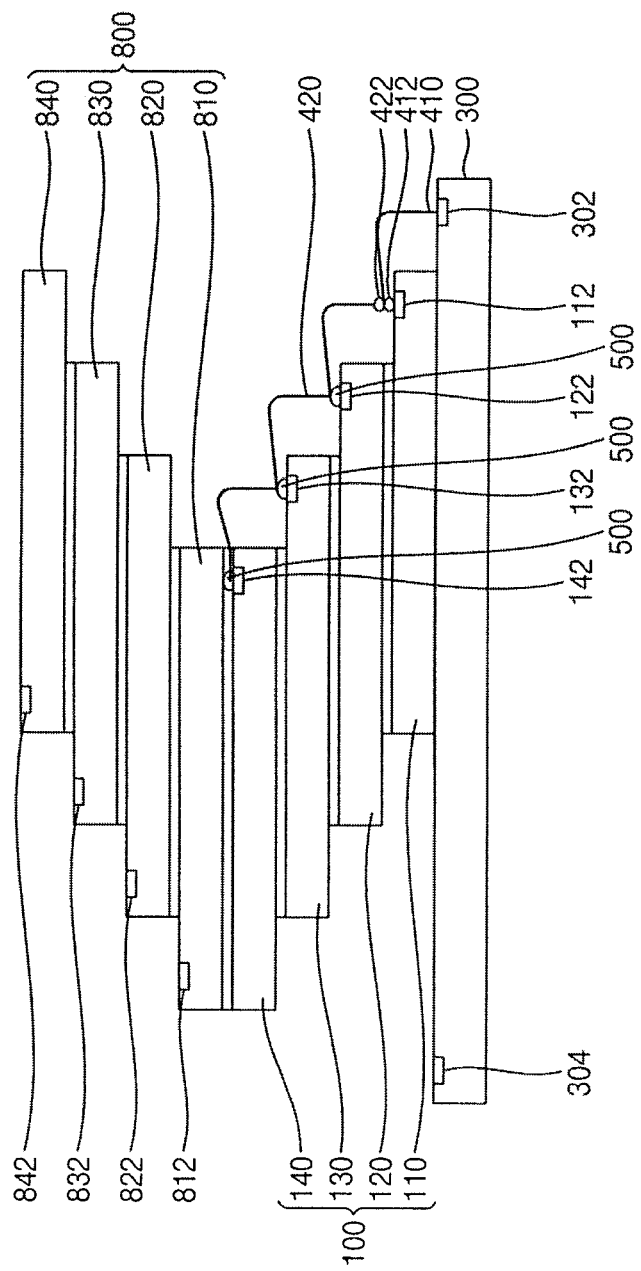
FIGS. 14 to 23 illustrate cross-sectional views of stages in a method of manufacturing the multi-chip package in FIG. 13.

Referring to FIG. 14, the first semiconductor chip 810 may be stacked on the upper surface of the fourth semiconductor chip 140 in the first group. The second semiconductor chip 820 may be stacked on the upper surface of the first semiconductor chip 810 to expose the first bonding pad 812. The third semiconductor chip 830 may be stacked on the upper surface of the second semiconductor chip 820 to expose the second bonding pad 822. The fourth semiconductor chip 840 may be stacked on the upper surface of the third semiconductor chip 830 to expose the third bonding pad 832.

Figure 15:
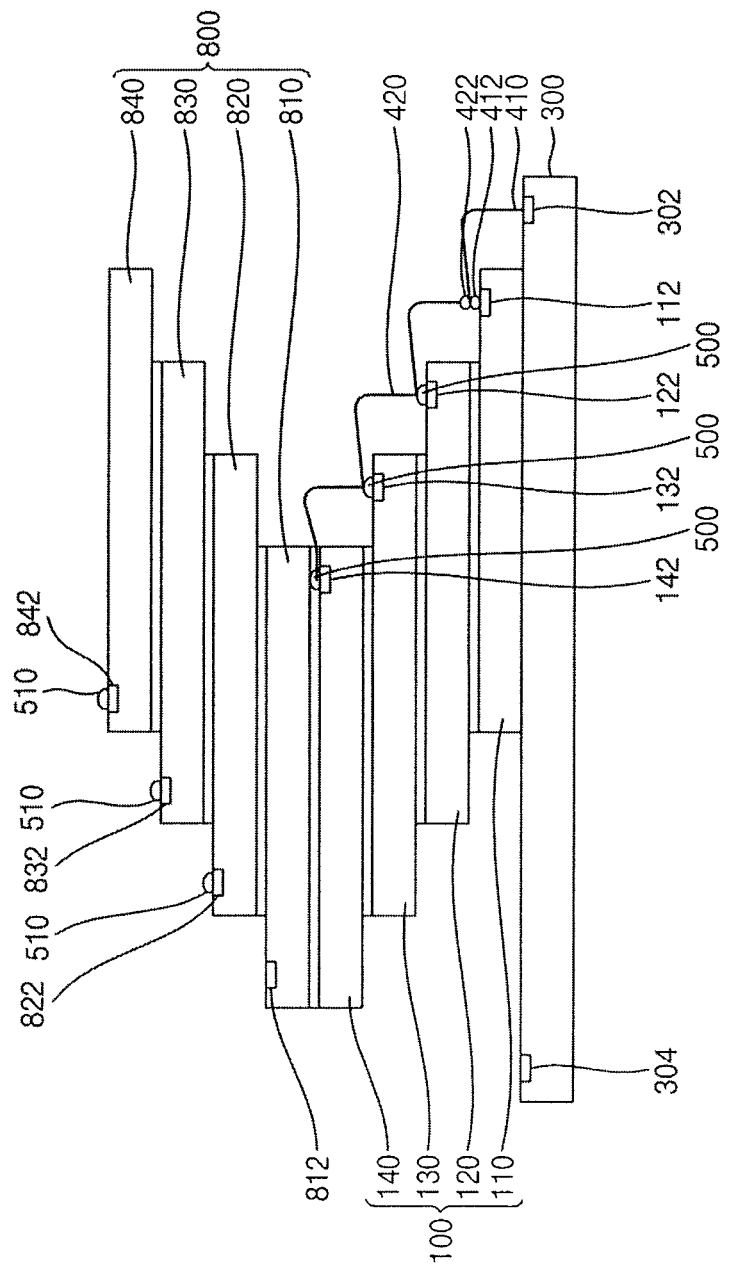

Referring to FIG. 15, the second stud bumps 510 may be formed on the second bonding pad 822, the third bonding pad 832, and the fourth bonding pad 842. In contrast, the second stud bump 510 may not be formed on the first bonding pad 812.

Figure 16:
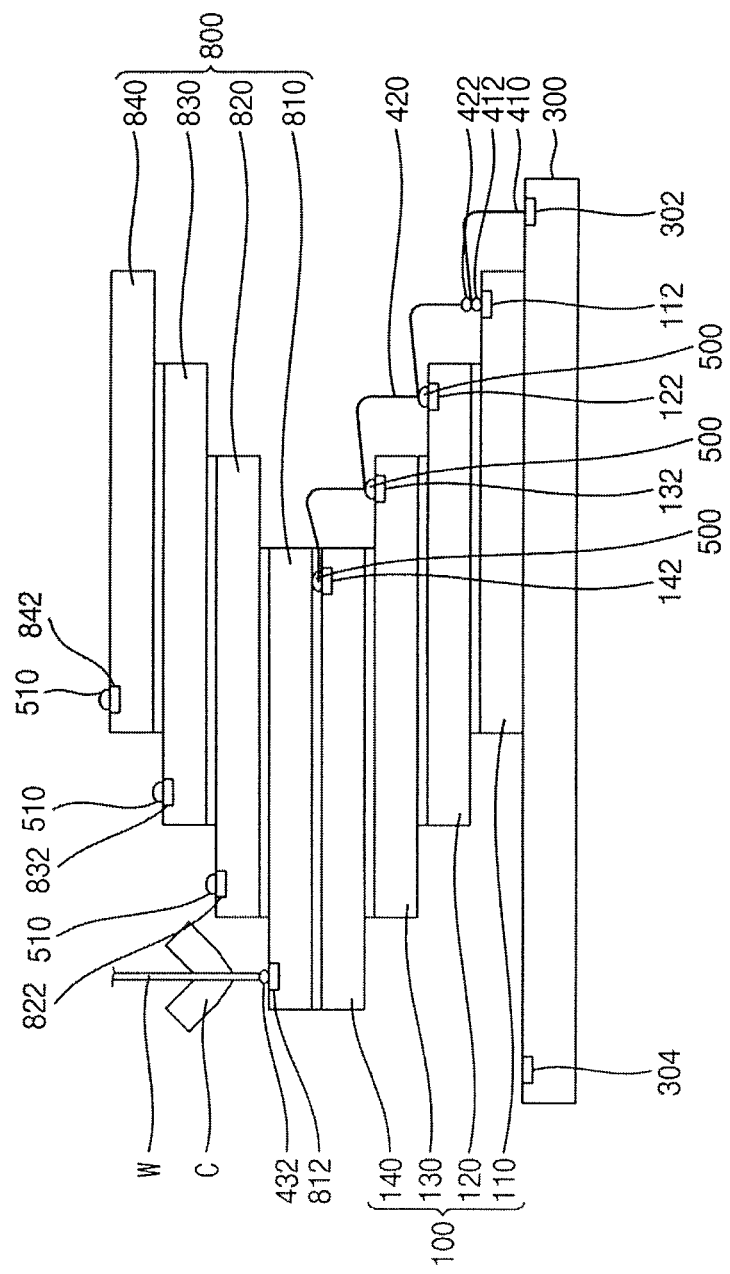

Referring to FIG. 16, the capillary C may be arranged over the first bonding pad 812. The third ball 432 may be formed at the lower end of the wire W drawn from the capillary C. The third ball 432 may be attached to the first bonding pad 812.

Figure 17:
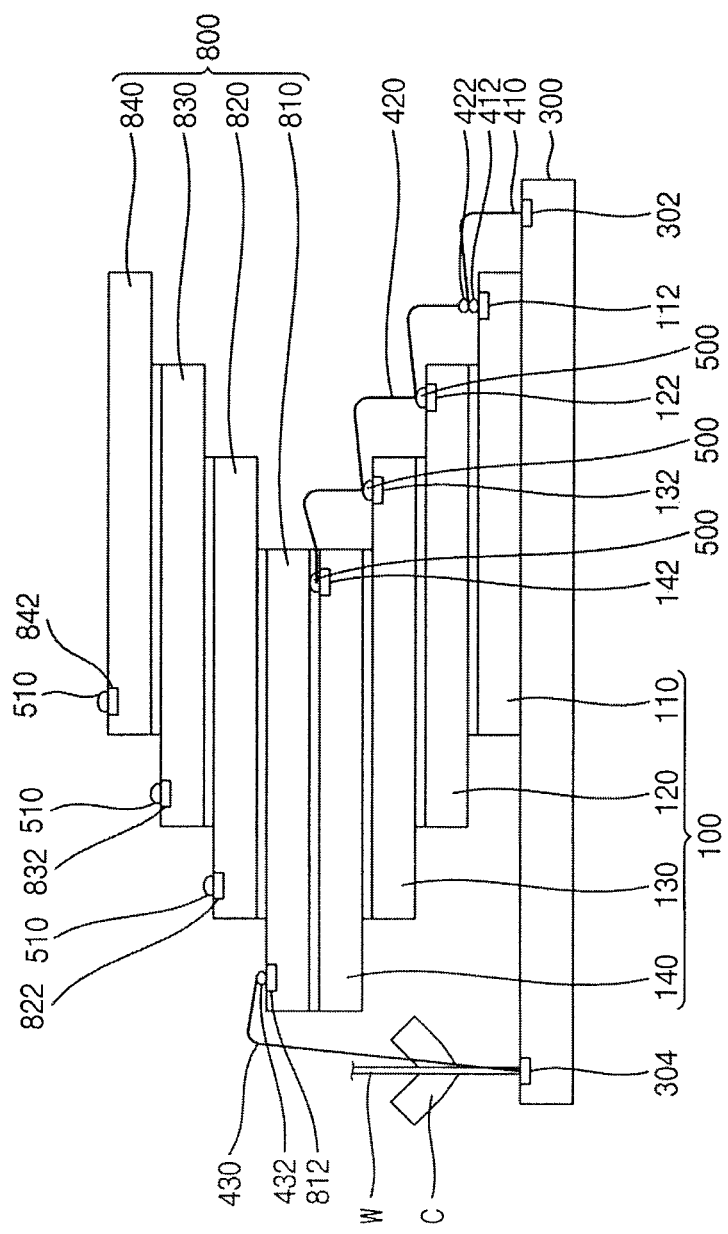

Referring to FIG. 17, the capillary C may be moved to a region over the second substrate pad 304 in the horizontal direction. Thus, the wire W extended from the third ball 432 may be located over the second substrate pad 304. The capillary C may be downwardly moved toward the second substrate pad 304 to stitch the wire W to the second substrate pad 304.

Figure 18:
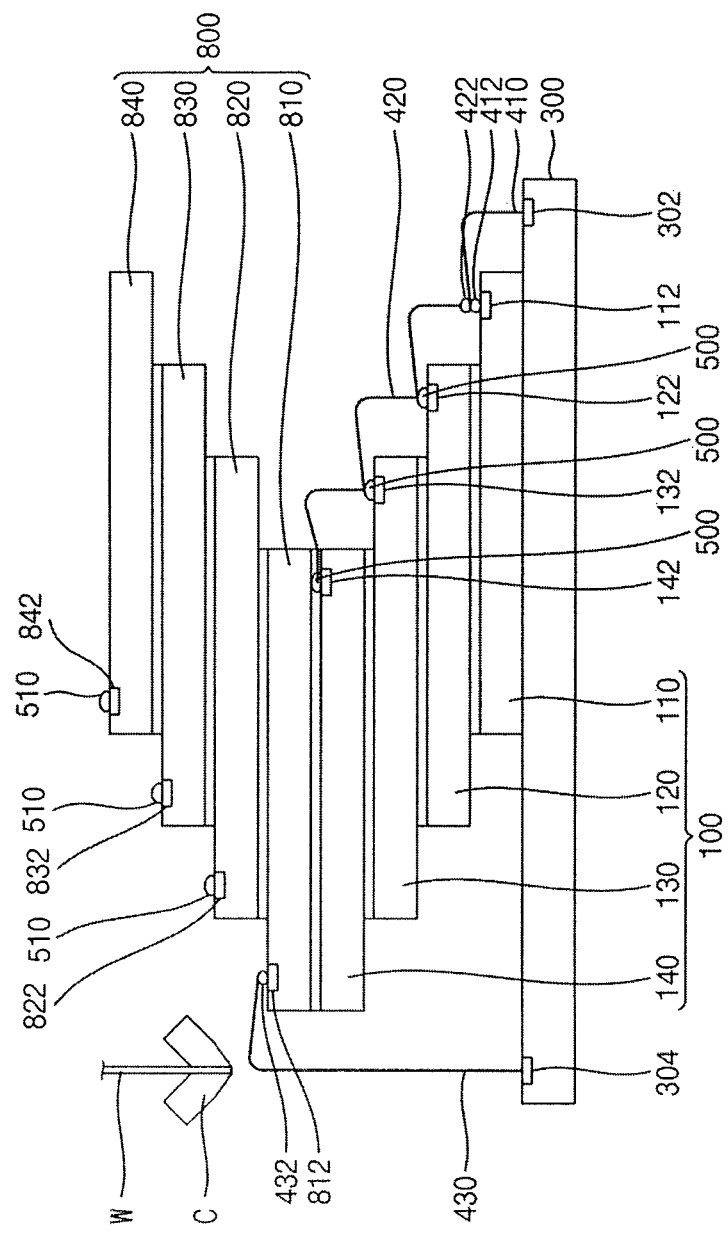

Referring to FIG. 18, the wire W extended from the second substrate pad 304 to the capillary C may be cut to form the third conductive wire 430. The third conductive wire 430 may be downwardly extended from the third ball 432 attached to the first bonding pad 812. The third conductive wire 430 may be connected to the second substrate pad 304.

Figure 19:
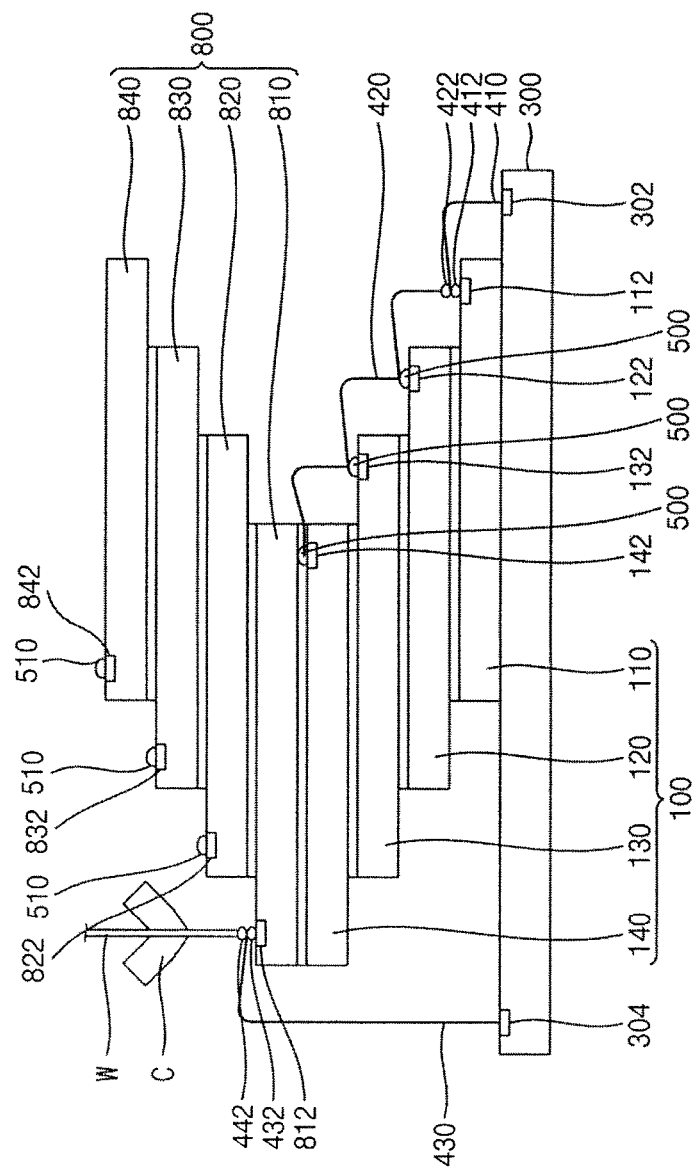

Referring to FIG. 19, the capillary C may be arranged over the first bonding pad 812. The fourth ball 442 may be formed at a lower end of the wire W drawn from the capillary C. The fourth ball 442 may be attached to the third ball 432.

Figure 20:
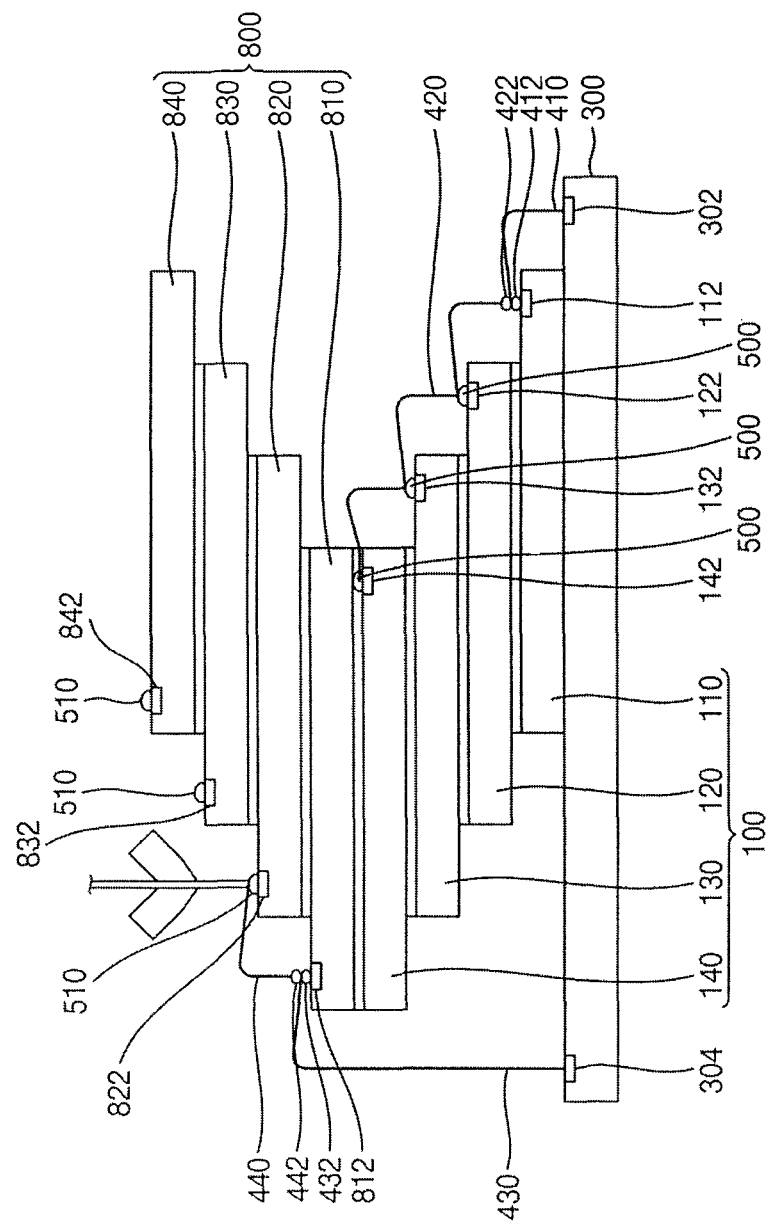

Referring to FIG. 20, the capillary C may be upwardly moved in the vertical direction. The capillary C may then be moved toward the second bonding pad 822 in the horizontal direction. Thus, the wire W extended from the fourth ball 442 may be connected to the second stud bump 510 on the second bonding pad 822. Because the capillary C may be moved in the horizontal direction after upwardly moving the capillary C, a sufficient gap between the loop formed by the wire W and the side surface of the second semiconductor chip 820 may be formed. Therefore, the wire W may not make contact with the side surface of the second semiconductor chip 820.

Figure 21:
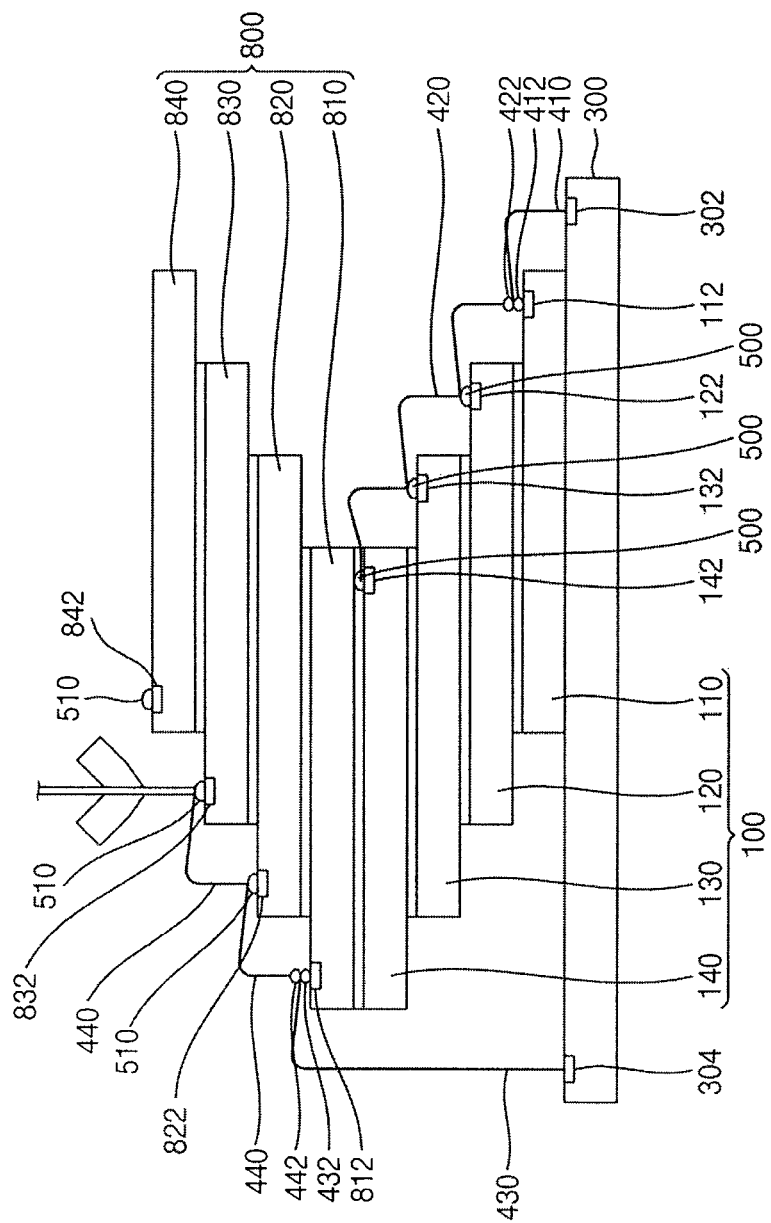

Referring to FIG. 21, the capillary C may be upwardly moved in the vertical direction. The capillary C may then be moved toward the third bonding pad 832 in the horizontal direction. Thus, the wire W extended from the second stud bump 510 on the second bonding pad 822 may be connected to the second stud bump 510 on the third bonding pad 832. As mentioned above, because the capillary C may be moved in the horizontal direction after upwardly moving the capillary C, a sufficient gap between the loop formed by the wire W and the side surface of the third semiconductor chip 830 may be formed. Therefore, the wire W may not make contact with the side surface of the third semiconductor chip 830.

Figure 22:
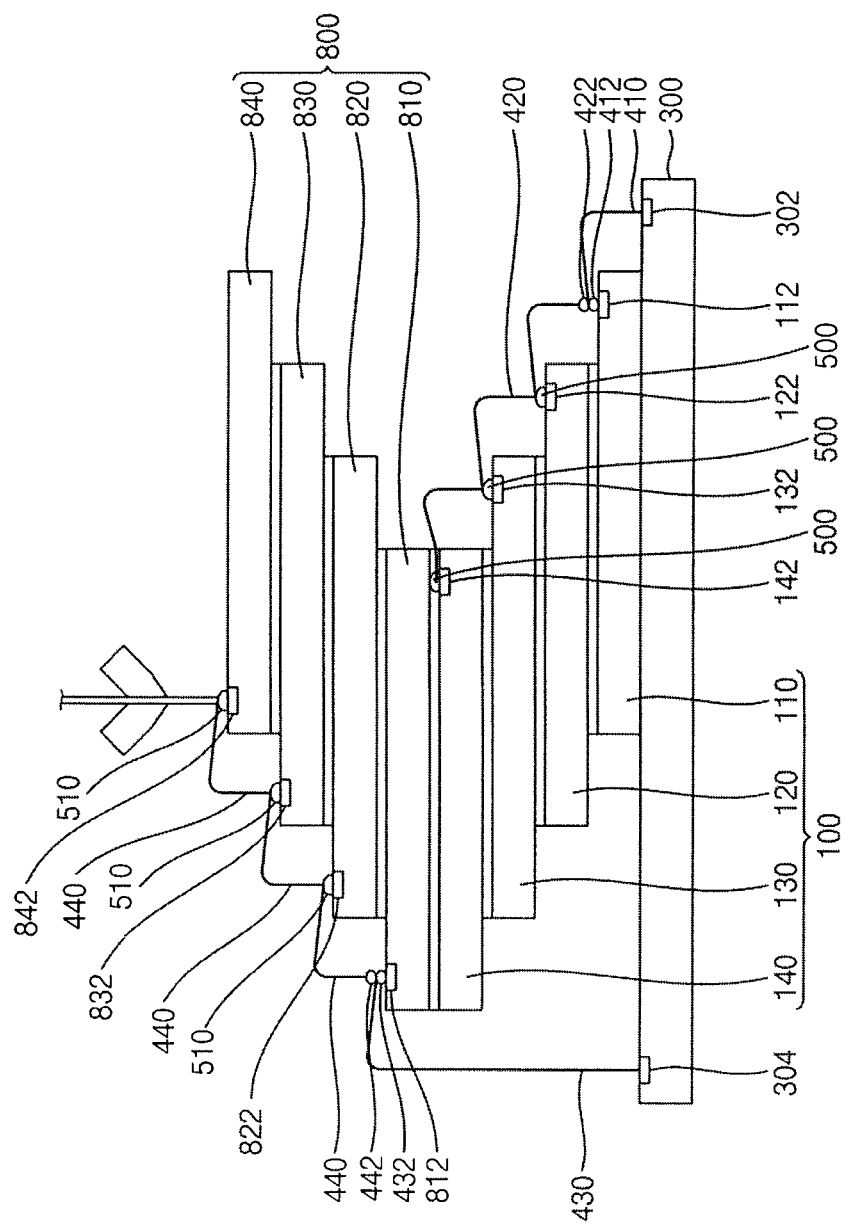

Referring to FIG. 22, the capillary C may be upwardly moved in the vertical direction. The capillary C may then be moved toward the fourth bonding pad 842 in the horizontal direction. Thus, the wire W extended from the second stud bump 510 on the third bonding pad 832 may be connected to the second stud bump 510 on the fourth bonding pad 842. As mentioned above, because the capillary C may be moved in the horizontal direction after upwardly moving the capillary C, a sufficient gap between the loop formed by the wire W and the side surface of the fourth semiconductor chip 840 may be formed. Therefore, the wire W may not make contact with the side surface of the fourth semiconductor chip 840.

Figure 23:
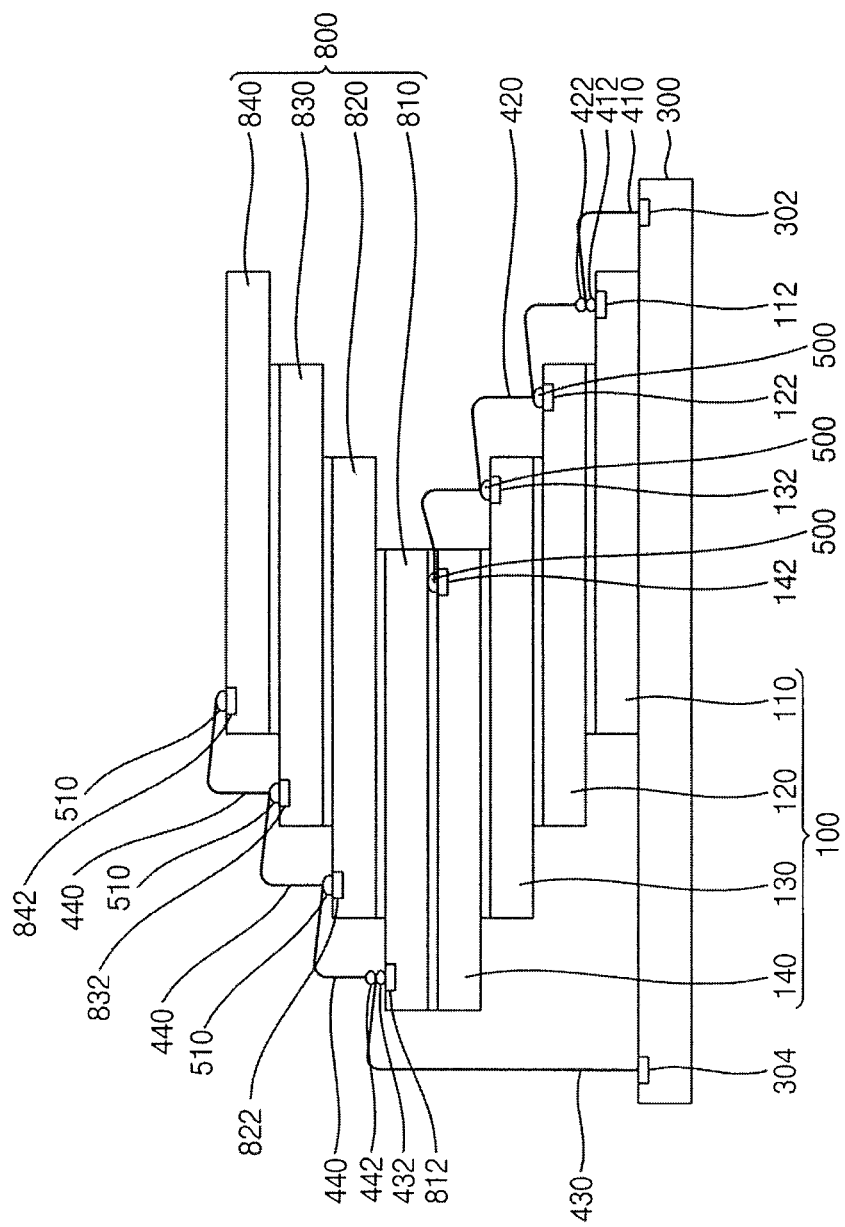

Referring to FIG. 23, the wire W extended from the second stud bump 510 on the fourth bonding pad 842 to the capillary C may be cut to form the fourth conductive wire 440. The fourth conductive wire 440 may be upwardly extended from the fourth ball 442 attached to the third ball 432. The fourth conductive wire 440 may be sequentially connected with the second stud bumps 510 on the second to fourth bonding pads 822, 832 and 842.

The molding member 610 may be formed on the upper surface of the package substrate 300 to cover the first group of the semiconductor chips 100, the second group of the semiconductor chips 800 and the first to fourth conductive wires 410, 420, 430 and 440. The external terminals 710 may be mounted on the lower ends of the conductive patterns exposed through the lower surface of the package substrate 300 to complete the multi-chip package in FIG. 13.

Figure 24:
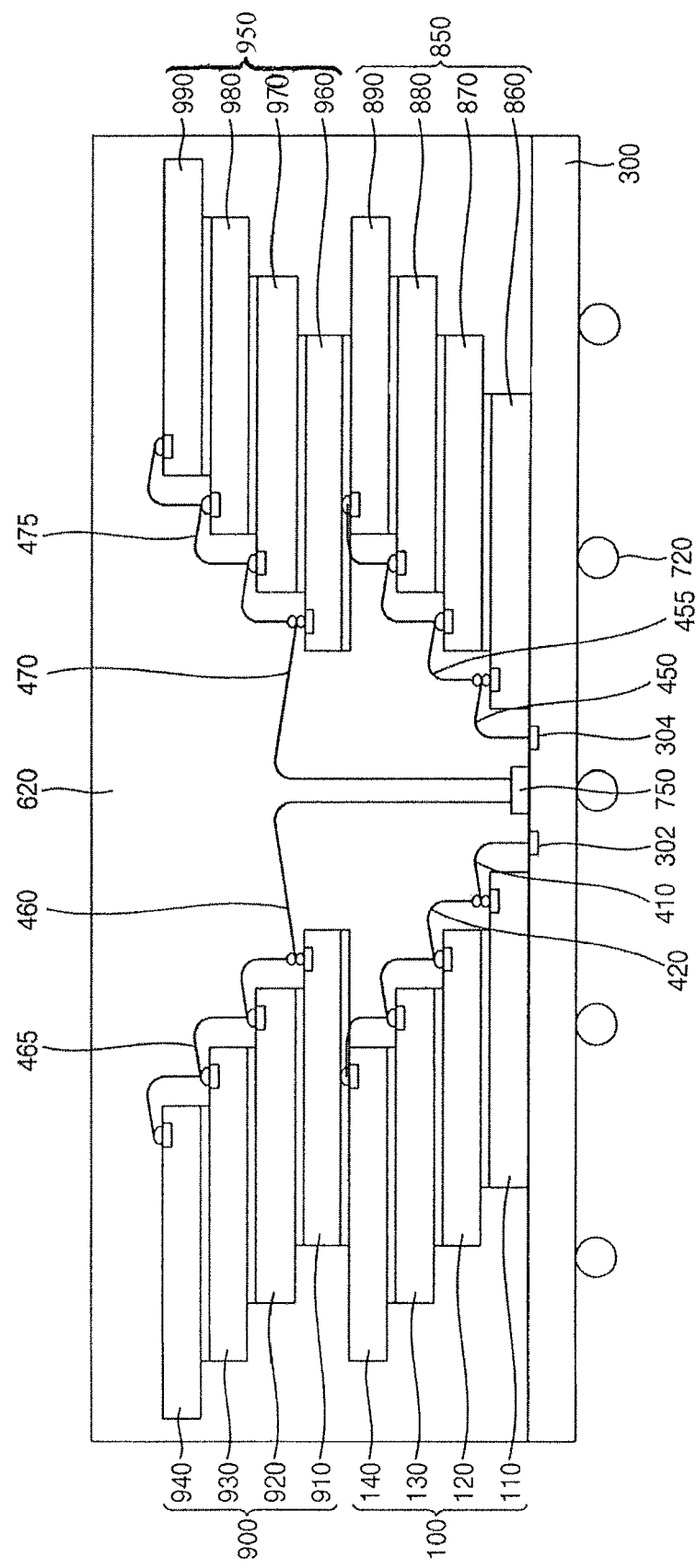
FIG. 24 illustrates a cross-sectional view of a multi-chip package in accordance with example embodiments.

FIG. 24 is a cross-sectional view illustrating a multi-chip package in accordance with example embodiments.

Referring to FIG. 24, a multi-chip package of this example embodiment may include the package substrate 300, the first group of semiconductor chips 100, the second group of semiconductor chips 850, a third group of semiconductor chips 900, a fourth group of semiconductor chips 950, a control chip 750, a molding member 620, and external terminals 720.

The package substrate 300 may include the first substrate pad 302 and the second substrate pad 304. The control chip 750 may be positioned at a central portion of the upper surface of the package substrate 300. The first substrate pad 302 may be positioned on the upper surface of the package substrate 300, e.g., left of the control chip 750. The second substrate pad 304 may be positioned on of the upper surface of the package substrate 300, e.g., right of the control chip 750. The control chip 750 may be electrically connected with the first and second substrate pads 302 and 304.

The first group of the semiconductor chips 100 may be stacked on a left portion of the upper surface of the package substrate 300 along the left direction in a steplike shape. The second group of the semiconductor chips 850 may be stacked on a right portion of the upper surface of the package substrate 300 along the right direction in a steplike shape. The third group of the semiconductor chip 900 may be stacked on the first group of the semiconductor chip 100 along the left direction in a steplike shape. The fourth group of the semiconductor chips 950 may be stacked on the second group of the semiconductor chips 850 along the right direction in a steplike shape.

Wire bonding structures of the first to fourth groups of the semiconductor chips 100, 850, 900, and 950 may be substantially the same as the wire bonding structure of the first group of the semiconductor chips 100 in FIG. 13. The first conductive wire 410 of the first group of the semiconductor chips 100 and a fifth conductive wire 450 of the second group of the semiconductor chips 850 may have functions and a shape substantially the same as those of the first conductive wire 410 of the first group of the semiconductor chips 100 in FIG. 13. The second conductive wire 420 of the first group of the semiconductor chips 100 and a sixth conductive wire 455 of the second group of the semiconductor chips 850 may have functions and a shape substantially the same as those of the second conductive wire 420 of the first group of the semiconductor chips 100 in FIG. 13. A third conductive wire 460 of the third group of the semiconductor chips 900 and a seventh conductive wire 470 of the fourth group of the semiconductor chips 950 may have functions and a shape substantially the same as those of the third conductive wire 430 of the second group of the semiconductor chips 800 in FIG. 13. A fourth conductive wire 465 of the third group of the semiconductor chips 900 and an eighth conductive wire 475 of the fourth group of the semiconductor chips 950 may have functions and a shape substantially the same as those of the fourth conductive wire 440 of the second group of the semiconductor chips 800 in FIG. 13. Thus, any further illustrations with respect to the wire bonding structures of the first to fourth groups of the semiconductor chips 100, 850, 900, and 950 may be omitted herein for brevity.

The first group of the semiconductor chips 100 may be electrically connected with the first substrate pad 302. The second group of the semiconductor chips 850 may be electrically connected with the second substrate pad 304. The third and fourth groups of the semiconductor chips 900 and 950 may be electrically connected with the control chip 750. Alternatively, the third group of the semiconductor chips 900 may be electrically connected with the first substrate pad 302. The fourth group of the semiconductor chips 950 may be electrically connected with the second substrate pad 304.

The multi-chip package of this example embodiment may be manufactured by performing the above-mentioned processes illustrated with reference to FIGS. 3 to 12 on the first to fourth groups of the semiconductor chips 100, 850, 900, and 950. Thus, any further illustrations with respect to a method of manufacturing the multi-chip package of this example embodiment may be omitted herein for brevity.

Figure 25:
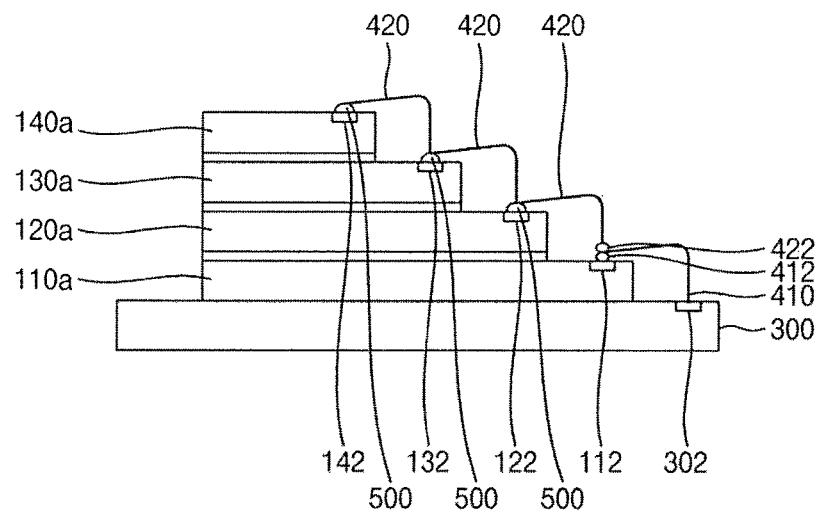
FIG. 25 illustrates a cross-sectional view of a multi-chip package in accordance with example embodiments.

FIG. 25 is a cross-sectional view illustrating a multi-chip package in accordance with example embodiments. A multi-chip package of this example embodiment may include elements substantially the same as those of the multi-chip package in FIG. 1 except for sizes of semiconductor chips. Thus, the same reference numerals may refer to the same elements and any further illustrations with respect to the same elements may be omitted herein for brevity.

Referring to FIG. 25, first to fourth semiconductor chips 110a, 120a, 130a, and 140a may have substantially the same width. The width may be measured along an arranging direction of the bonding pads. In contrast, the first to fourth semiconductor chips 110a, 120a, 130a, and 140a may have different lengths. The lengths may be measured along a direction substantially perpendicular to the arranging direction of the bonding pads.

In example embodiments, the first semiconductor chip 110a may have the longest length. The fourth semiconductor chip 140a may have the shortest length. Thus, left side surfaces of the first to fourth semiconductor chips 110a, 120a, 130a and 140a may be positioned on a vertical plane, e.g., may be aligned.

Figure 26:
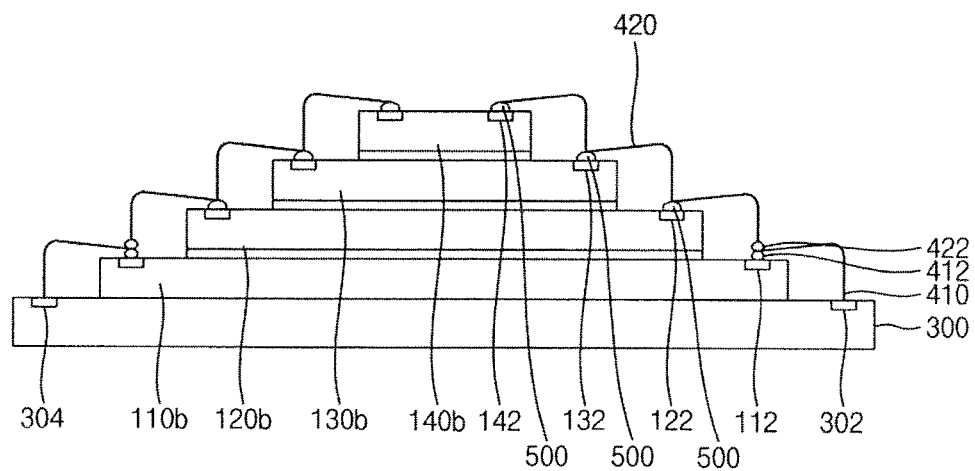
FIG. 26 illustrates a cross-sectional view of a multi-chip package in accordance with example embodiments.

FIG. 26 is a cross-sectional view illustrating a multi-chip package in accordance with example embodiments. A multi-chip package of this example embodiment may include elements substantially the same as those of the multi-chip package in FIG. 1 except for sizes of semiconductor chips. Thus, the same reference numerals may refer to the same elements and any further illustrations with respect to the same elements may be omitted herein for brevity.

Referring to FIG. 26, first to fourth semiconductor chips 110b, 120b, 130b, and 140b may have different widths and lengths. In example embodiments, the first semiconductor chip 110b may have the widest width and the longest length. The fourth semiconductor chip 140b may have the narrowest width and the shortest length. Thus, the stacked first to fourth semiconductor chips 110b, 120b, 130b and 140b may have a pyramidal steplike shape.

By way of summation and review, a bonding time using the conductive wires may be too long. Further, failures may be generated in loops formed by the conductive wires due to a narrow gap between the semiconductor chips and the corresponding wire loops.

In contrast, example embodiments may provide a multi-chip package without failures of a wire loop and a curtailed wire bonding time. Example embodiments may also provide a method of manufacturing the above-mentioned multi-chip package.

That is, according to example embodiments, the first conductive wire in the multi-chip package may be downwardly extended from the bonding pad of the lowermost semiconductor chip. The first conductive wire may be connected to the substrate pad of the package substrate. Thus, the first conductive wire may be firmly fixed to the substrate pad. Further, the second conductive wire may be upwardly extended from the bonding pad of the lowermost semiconductor chip. The second conductive wire may be sequentially and continuously connected to the stud bumps of the semiconductor chips of the multi-chip package above the first semiconductor chip. Thus, a loop formed by the second conductive wire may be spaced apart from side surfaces of the semiconductor chip by a sufficient gap so that the second conductive wire may not make contact with the side surfaces of the semiconductor chips. Further, as a wire bonding process includes only twice cutting the first and second conductive wires, e.g., as the second wire extends continuously to contact multiple semiconductor chips with a single cutting step at the top semiconductor chip, a wire bonding time may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A multi-chip package, comprising:
a package substrate including a first substrate pad;
a first group of semiconductor chips stacked on the package substrate, each one of the semiconductor chips in the first group including at least one bonding pad;
first stud bumps arranged on the bonding pads of the first group of the semiconductor chips except for a lowermost semiconductor chip in the first group;
a first conductive wire downwardly extended from the at least one bonding pad of the lowermost semiconductor chip in the first group and connected to the first substrate pad; and
a second conductive wire upwardly extended from the at least one bonding pad of the lowermost semiconductor chip in the first group and sequentially connected to the first stud bumps, the second conductive wire being a single wire continuously extending from the lowermost semiconductor chip to the first stud bumps in a steplike shape.

2. The multi-chip package as claimed in claim 1, wherein the semiconductor chips in the first group are stacked in a steplike shape to expose the bonding pads.

3. The multi-chip package as claimed in claim 1, wherein the semiconductor chips in the first group have substantially a same size.

4. The multi-chip package as claimed in claim 1, wherein the first conductive wire includes a first ball attached to the at least one bonding pad of the lowermost semiconductor chip in the first group of the semiconductor chips.

5. The multi-chip package as claimed in claim 4, wherein the second conductive wire includes a second ball attached to the first ball.

6. The multi-chip package as claimed in claim 5, wherein the second wire is continuously connected between the second ball and the first stud bump, and between the first stud bumps.

7. The multi-chip package as claimed in claim 1, wherein the package substrate further includes a second substrate pad.

8. The multi-chip package as claimed in claim 7, further comprising:
a second group of semiconductor chips stacked on an uppermost semiconductor chip of the first group of the semiconductor chips, each one of the semiconductor chips in the second group including at least one bonding pad;
second stud bumps arranged on the bonding pads of the second group of the semiconductor chips except for a lowermost semiconductor chip in the second group;
a third conductive wire downwardly extended from the at least one bonding pad of the lowermost semiconductor chip in the second group and connected to the second substrate pad; and
a fourth conductive wire upwardly extended from the at least one bonding pad of the lowermost semiconductor chip in the second group and sequentially connected to the second stud bumps.

9. The multi-chip package as claimed in claim 8, wherein the semiconductor chips in the second group are stacked in a steplike shape along a direction opposite to a stacking direction of the first group of the semiconductor chips to expose the bonding pads of the second group of the semiconductor chips.

10. The multi-chip package as claimed in claim 8, wherein the semiconductor chips in the second group have substantially a same size.

11. The multi-chip package as claimed in claim 10, wherein a number of semiconductor chips in the second group of the semiconductor chips is substantially the same as that of the semiconductor chips in the first group of the semiconductor chips.

12. The multi-chip package as claimed in claim 8, wherein the third conductive wire includes a third ball attached to the at least one bonding pad of the lowermost semiconductor chip in the second group.

13. The multi-chip package as claimed in claim 12, wherein the fourth conductive wire includes a fourth ball attached to the third ball.

14. The multi-chip package as claimed in claim 13, wherein the fourth conductive wire includes a single wire continuously connected between the fourth ball and the second stud bump, and between the second stud bumps.

15. A multi-chip package, comprising:
a package substrate including a substrate pad;
first to fourth semiconductor chips stacked on the package substrate in a steplike shape, each of the first to fourth semiconductor chips including at least one bonding pad, and the first to fourth semiconductor chips having substantially the same size;
stud bumps arranged on the bonding pads of the second to fourth semiconductor chips;
a first conductive wire including a first ball attached to the at least one bonding pad of the first semiconductor chip, the first conductive wire downwardly extended from the first ball and connected to the substrate pad; and
a second conductive wire including a second ball attached to the first ball, the second conductive wire upwardly extended from the second ball and sequentially connected to the stud bumps.

16. The multi-chip package as claimed in claim 15, wherein the second wire includes a single wire continuously connected between the second ball and the stud bump, and between the stud bumps.

17. A multi-chip package, comprising:
a package substrate including a first substrate pad;
a first group of semiconductor chips stacked on the package substrate, each one of the semiconductor chips in the first group including at least one bonding pad;
a first stud bump on each bonding pad of the first group of the semiconductor chips except for a lowermost semiconductor chip in the first group;
a first conductive wire extending from the at least one bonding pad of the lowermost semiconductor chip in the first group to contact the first substrate pad; and
a second conductive wire extending continuously from the at least one bonding pad of the lowermost semiconductor chip in the first group to contact at least one first stud bump on each of the semiconductor chips in the first group, the second conductive wire being a single wire continuously extending from the lowermost semiconductor chip to the first stud bumps in a steplike shape.

18. The multi-chip package as claimed in claim 17, wherein the semiconductor chips in the first group are stacked in a steplike structure, the second conductive wire extending continuously and sequentially along each step of the steplike structure above the lowermost semiconductor chip.

19. The multi-chip package as claimed in claim 17, wherein the first and second conductive wires are connected to each other on the lowermost semiconductor chip via a ball.

20. The multi-chip package as claimed in claim 17, wherein each of the first and the second conductive wires includes two linear wire portions between every two semiconductor chips, the two linear wire portions being connected to each other at a non-zero angle.

* * * * *